(12) United States Patent
Kruijswijk et al.

(10) Patent No.: US 7,224,440 B2
(45) Date of Patent: May 29, 2007

(54) LITHOGRAPHIC APPARATUS AND DEVICE MANUFACTURING METHOD

(75) Inventors: Stefan Geerte Kruijswijk, Eindhoven (NL); Marcel Mathijs Theodore Marie Dierichs, Venlo (NL); Markus Franciscus Antonius Eurlings, Tilburg (NL); Heine Melle Mulder, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 160 days.

(21) Appl. No.: 11/019,525

(22) Filed: Dec. 23, 2004

(65) Prior Publication Data
US 2006/0139599 A1 Jun. 29, 2006

(51) Int. Cl.
*G03B 27/52* (2006.01)
(52) U.S. Cl. .......................................... 355/67; 355/71
(58) Field of Classification Search .................. 355/67, 355/71
See application file for complete search history.

(56) References Cited
U.S. PATENT DOCUMENTS 6,452,662 B2 *  9/2002  Mulkens et al. .............. 355/67
6,513,953 B1 *  2/2003  Itoh ............................. 362/331
6,527,393 B1 *  3/2003  Ogawa ......................... 353/38
6,607,276 B1 *  8/2003  Akiyama ...................... 353/38
2005/0225978 A1 * 10/2005 Simaoka et al. ............. 362/235

FOREIGN PATENT DOCUMENTS

JP          05-346557       * 12/1993

* cited by examiner

*Primary Examiner*—D. Rutledge
(74) *Attorney, Agent, or Firm*—Pillsbury Winthrop Shaw Pittman LLP

(57) ABSTRACT

A lithographic apparatus includes an illumination system configured to provide a radiation beam; a patterning device configured to pattern the radiation beam to form a patterned radiation beam; and a projection system configured to project the patterned radiation beam onto a substrate. An optical assembly includes multiple optical elements two-dimensionally arranged between a radiation source and the patterning device to create a predetermined angular distribution of the radiation beam. In order to improve the uniformity of the radiation beam the optical elements are selected from a predetermined number of optical elements having different shapes and/or sizes.

27 Claims, 9 Drawing Sheets

LITHOGRAPHIC APPARATUS AND DEVICE MANUFACTURING METHOD

BACKGROUND OF THE INVENTION

1. Field of the Invention

The present invention relates to a lithographic apparatus and a method for manufacturing a device.

2. Description of the Related Art

A lithographic apparatus is a machine that applies a desired pattern onto a substrate, usually onto a target portion of the substrate. A lithographic apparatus can be used, for example, in the manufacture of integrated circuits (ICs) An example of such an integrated circuit is a CMOS image sensor or a charge-coupled device (CCD) image sensor. In the manufacturing of those devices, a patterning device, which may be alternatively referred to as a mask or a reticle, may be used to generate a circuit pattern to be formed on an individual layer of the IC or image sensor. This pattern can be transferred onto a target portion (e.g. including part of one or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam having a rectangular shape in a given direction (the "scanning" direction) while synchronously scanning the substrate parallel or anti-parallel to this direction. In order to obtain a uniform illumination of the pattern the lithography apparatus includes a multi lens array. The multi lens array equalizes the intensity distribution in the illumination beam.

The intra-dose uniformity IDU is defined as $$IDU = \frac{3\sigma}{M}100\%$$

wherein σ represents the standard deviation of the measuring intensities, and M represents the average of the measured intensities in the rectangle shape illuminated by the slit. In case CMOS sensors or CCD sensor are manufactured with the aid of the known lithographic projection very tight restrictions are necessary of the intra-field dose uniformity, because small variations in the intra-field dose may cause undesired variations in the captured image of the CMOS sensor or CCD sensor.

SUMMARY OF THE INVENTION

It is an aspect of the present invention to provide a lithographic apparatus having an improved uniformity of the radiation beam.

According to an embodiment of the present invention, a lithographic apparatus includes a radiation source configured to provide radiation; an illumination system configured to provide a radiation beam from the radiation; a patterning device configured to impart the radiation beam with a pattern in its cross-section to form a patterned radiation beam; a projection system configured to project the patterned radiation beam onto a substrate; and an optical assembly including a plurality of optical elements two-dimensionally arranged between the radiation source and the patterning device and configured to create a predetermined angular distribution of the radiation beam, the optical elements being selected from a predetermined number of optical elements having different shapes.

The optical elements may be of a single type, for example the optical elements may all be lenses, lenticulars, Fresnel elements or wedge elements, but of different size and/or shape. For example, some of the lenses may be rectangular and some square, and/or each of the rectangular lenses and/or the square lenses may be different sizes. As another example, the wedge elements may have angles of the normal of the exit plane that vary.

According to another embodiment of the present invention, a lithographic apparatus includes an illumination system configured to provide a radiation beam; a modulator configured to spatially modulate the radiation beam with a predetermined pattern; a projection system configured to project the modulated radiation beam onto a substrate; and an optical assembly comprising multiple optical elements two-dimensionally arranged in the radiation beam and configured to create a predetermined angular distribution of the radiation beam, the optical elements being selected from a predetermined number of optical elements having different shapes.

According to still another embodiment of the present invention, a lithographic apparatus is configured to project a patterned radiation beam onto a substrate and includes an optical assembly including multiple optical elements two-dimensionally arranged in the radiation beam and configured to create a predetermined angular distribution of the radiation beam, the optical elements being selected from a predetermined number of optical elements having different shapes.

According to a yet further embodiment of the present invention, a lithographic apparatus includes an illumination system configured to provide a radiation beam; a patterning device configured to pattern the radiation beam; a projection system configured to project the patterned radiation beam onto a substrate, wherein the illumination system includes a radiation source configured to generate radiation and an optical assembly including multiple optical elements two-dimensionally arranged between the radiation source and the patterning device and configured to create a predetermined angular distribution of the radiation beam, the optical elements being selected from a predetermined number of optical elements having different shapes.

According to a still further embodiment of the present invention, an integrated device manufacturing method includes providing a radiation beam; patterning the radiation beam; and projecting the patterned radiation beam onto a target portion of a substrate, wherein providing the radiation beam includes creating a predetermined angular distribution of the radiation beam by passing the radiation beam through an optical assembly including multiple optical elements two-dimensionally arranged, the optical elements being selected from a predetermined number of optical elements having different shapes.

BRIEF DESCRIPTION OF THE DRAWINGS

Embodiments of the present invention will now be described, by way of example only, with reference to the accompanying schematic drawings in which corresponding reference symbols indicate corresponding parts, and in which.

DETAILED DESCRIPTION

Figure 1:
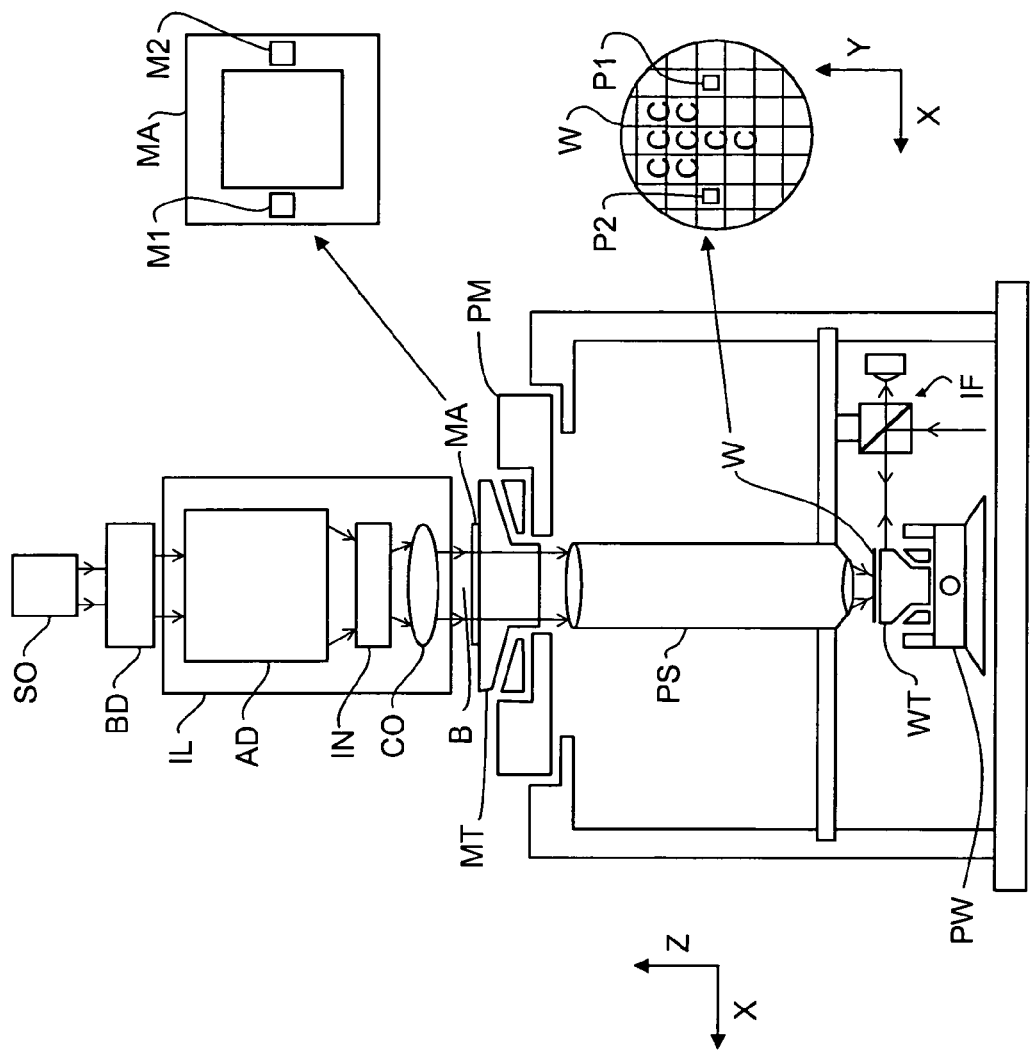
FIG. 1 shows a lithographic apparatus according to an embodiment of the present invention.

FIG. 1 schematically depicts a lithographic apparatus according to one embodiment of the present invention that includes an illumination system (illuminator) IL configured to condition a radiation beam B (e.g. UV radiation). A support (e.g. a mask table) MT is configured to support a patterning device (e.g. a mask) MA and is connected to a first positioning device PM configured to accurately position the patterning device in accordance with certain parameters. A substrate table (e.g. a wafer table) WT is configured to hold a substrate (e.g. a resist-coated wafer) W and is connected to a second positioning device PW configured to accurately position the substrate in accordance with certain parameters. A projection system (e.g. a refractive projection lens system) PS is configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, and/or control radiation.

The support supports, e.g. bears the weight of, the patterning device. It holds the patterning device in a manner that depends on the orientation of the patterning device, the design of the lithographic apparatus, and other conditions, such as for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located, for example, between the projection system and the substrate during exposure.

Referring to FIG. 1, the illuminator IL receives radiation from a radiation source SO. The source and the lithographic apparatus may be separate entities, for example when the source is an excimer laser. In such cases, the source is not considered to form part of the lithographic apparatus and the radiation is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjusting device AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support (e.g., mask table MT), and is patterned by the patterning device. Having traversed the mask MA, the radiation beam B passes through the projection system PS, which projects the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1 but which may also be an interferometric device, linear encoder or capacitive sensor) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT may be realized using a long-stroke module and a short-stroke module, which form part of the second positioning device PW. In the case of a stepper, as opposed to a scanner, the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
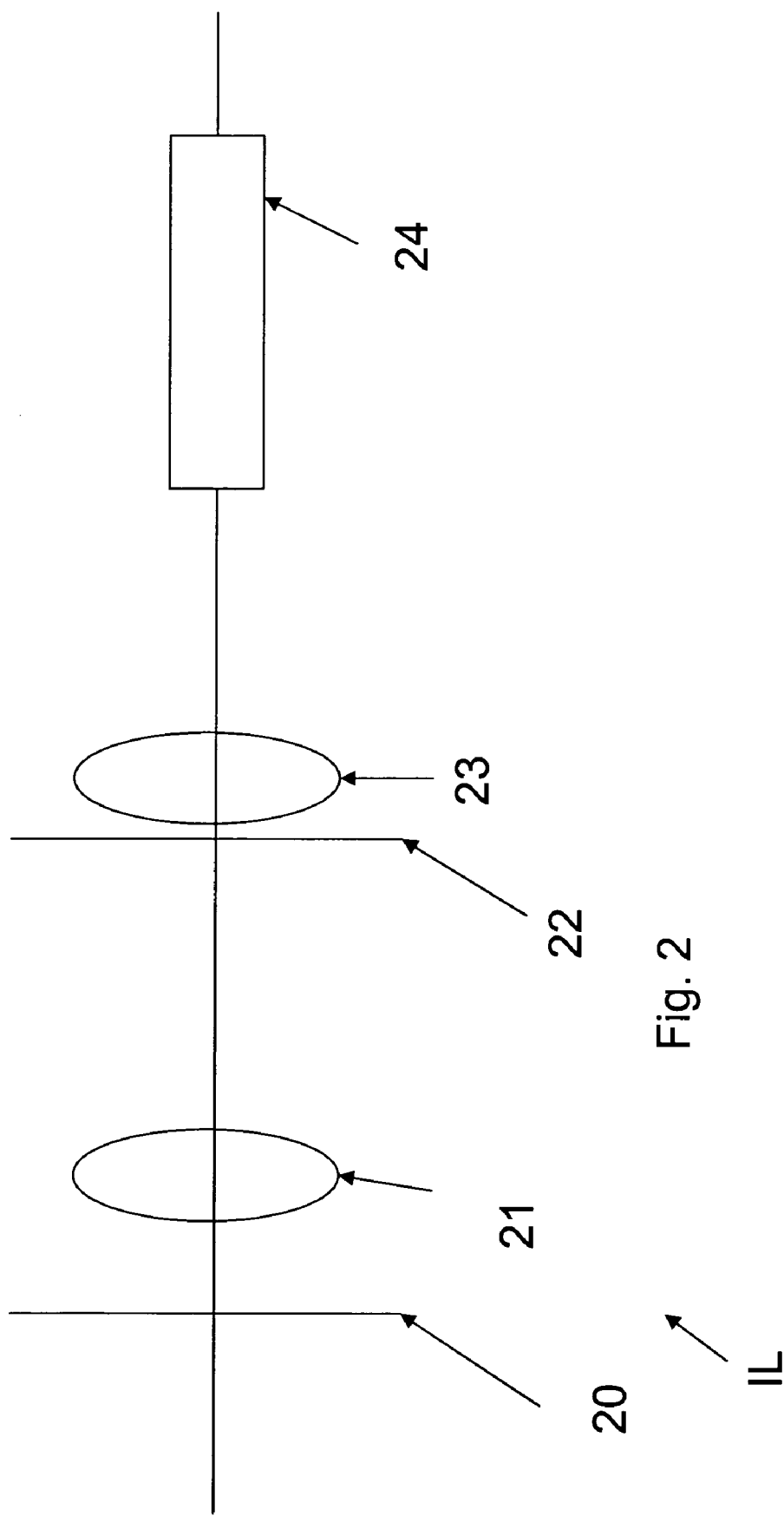
FIG. 2 shows a conventional illumination system.

FIG. 2 shows a conventional illuminator that can be used in the lithography apparatus as described in relation to FIG. 1. The conventional illuminator IL includes a diffractive optical element 20, a first condensing lens 21, an optical assembly 22, for example a micro lens array, and a second condensing lens 23. In operation, the diffractive optical element 20 creates multiple divergent first sub beams with a predetermined first angular distribution. The first lens 21 transforms the multiple first sub beams into a parallel illumination beam, and directs the parallel illumination beam to the micro lens array 22. The micro lens array 22 receives the parallel illumination beam and creates multiple divergent second sub beams with a predetermined second angular distribution. The second lens 23 transforms the multiple second sub beams into a parallel beam filling the illumination field on the pattern.

Furthermore, the illuminator IL may include an integrating rod 24 for further reduction of the intensity variation in the cross-section of the radiation beam parallel to the optical axis by multiple total internal reflections at the sides of the integrating rod. The integrating rod 24 may include quartz, fused silica or glass. In case an integrating rod is applied, the second condensing lens 23 transforms the multiple second sub beams into a parallel beam on the entrance plane of the integrating rod 24.

Figure 3:
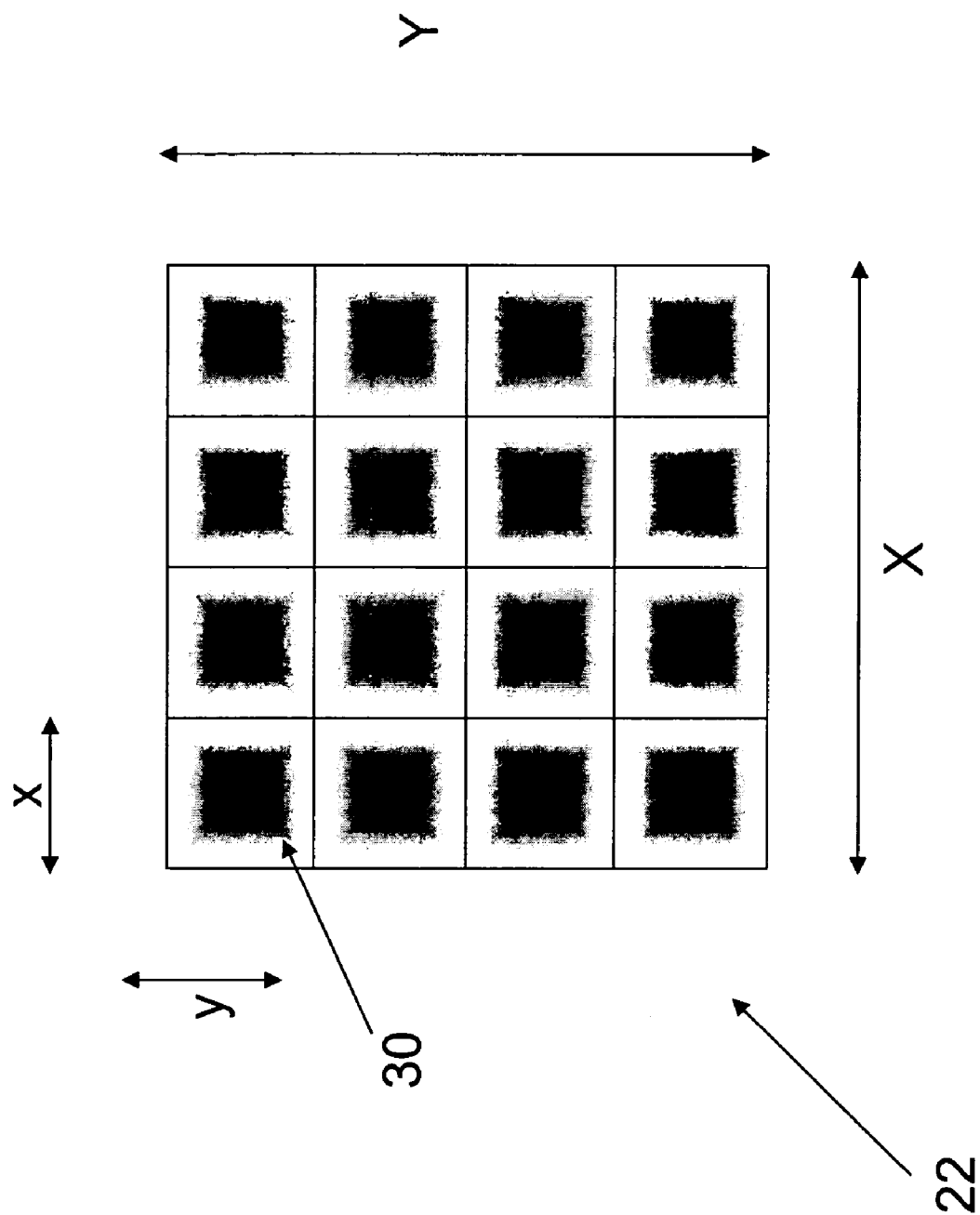
FIG. 3 shows a conventional micro lens array including, for example, a two-dimensional arrangement of lenses of equal size, shape and power.

FIG. 3 shows a conventional micro lens array 22 including, for example, a two-dimensional arrangement of lenses 30 of equal size, shape and power. Alternatively, the optical assembly 22 may include a two-dimensional arrangement of fresnel lenses of equal size, shape and power. In both cases each lens of the micro lenses creates a predetermined divergence in the beam. For example, the divergence of the portion of the beam passing the lens, in a first direction parallel to the long axis of the entrance plane of the rod integrator, is 14.5° and the divergence of the portion of the illumination beam passing the lens, in a second direction perpendicular to the first direction and parallel to the short axis of the entrance plane of the rod integrator, is 1°. Furthermore, in this application the first direction is indicated as X-direction. The second direction is indicated as Y-direction. The focal length of the individual lenses may be between 30 and 50 mm, for example 40 mm. Since the lenses 30 in the conventional micro lens array have been arranged in a regular pattern, the focal points introduces a grid like structure in the intensity distribution in the radiation beam at the entrance plane of the integrating rod 24. This grid like structure in the intensity distribution introduces a grid like non-uniformity in a rectangular illumination field of the pattern or a periodical variation in the angular distribution of the illumination in the rectangular illumination field on the pattern. The area of the illumination field on the pattern may be, for example, width multiplied by height is 26×6 mm$^2$. These non-uniformities in the illumination of the patterns may give rise to periodic artifacts in the end product, for example, a charge couple device, manufactured with the aid of the lithography apparatus.

These non uniformities may result in visible artifacts in a captured image of an electronic camera wherein this CCD is applied.

The non-uniformities can be quantified by an intra-dose uniformity. The intra-dose uniformity IDU is defined as $$IDU = \frac{3\sigma}{M} * 100\%,$$

wherein σ represents the standard deviation of the measuring intensities, and M represents the average of the measured intensities in the rectangle area illuminated by the illumination field.

In a conventional lithographic apparatus this IDU is, for example, approximately, 0.7%. These artifacts can be visible as stripes in an image captured by these charge coupled devices. In order to reduce these non-uniformities, the optical elements, i.e. the lenses of the optical assembly, have been selected from, for example, ten optical elements. The optical elements may be of different type. However, in practice the lenses have been selected of a single type. In that case the set includes, for example, eight lenses of equal power, but different diameters. The diameter of the n-th lens of the set is defined by (50+(n−1)*5) μm, where n represent the order number of the nth lens of the set. The selection is quasi-random in a sense that the number of the lenses of the set, i.e. the diameter of the lens, is selected according to a predetermined distribution, but with the condition that all the selected lenses should be fit in the fixed outer dimensions of the optical assembly and the average diameter is about 75 μm. The predetermined distribution may have a Gaussian shape, a uniform shape or a top hat shape.

Alternatively, the set may include three lenses of different power and different sizes whereby the power of the strongest lens of the set is 1.2 times the power of the weakest lens of the set and the diameter of the n lens is defined (50+(n−1)*5) μm.

Furthermore, the lenses can be spherical or aspherical shape. Aspherical lenses can be applied for matching the radiation profile of the micro-lens array with the dimensions of the illumination field or the entrance plane of the integrating rod 24, which dimensions deviate in a large extended form a circle. In this embodiment the intra-dose uniformity IDU is reduced to 0.01%. This embodiment can be used in the manufacturing of CMOS sensors or CCD sensor which require a intra-field dose uniformity smaller than, for example, 0.02%, because small variations in the intra-field dose may cause undesired visible variations in the captured image of the CMOS sensor or CCD sensor. All the lens elements can be integrated in a single micro lens array. The material of the micro lens array may be glass, fused silica, or $CaF_2$.

Figure 4:
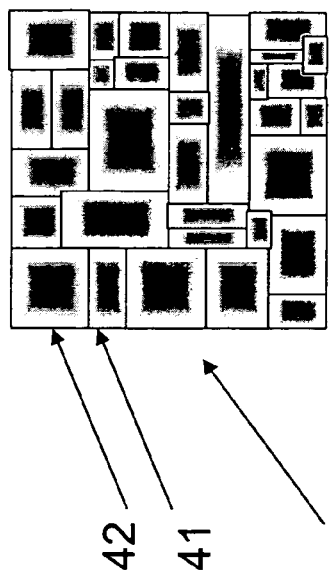
FIG. 4 shows an optical assembly including a selection from the set of 32 spherical lenses of equal power having different diameters.

FIG. 4 shows an embodiment of an optical assembly 40 including a selection of lenses 41,42 from the set of 32 spherical lenses of equal power having different diameters. The average diameter is about 80 μm. In this embodiment the shape of a cross-section transverse to the optical axis of the positive lens is a polygon wherein the angles of the polygon may be one of +90° or −90°. Alternatively, the shape of the cross-section can be a hexagon with angles of 135°.

Figure 5:
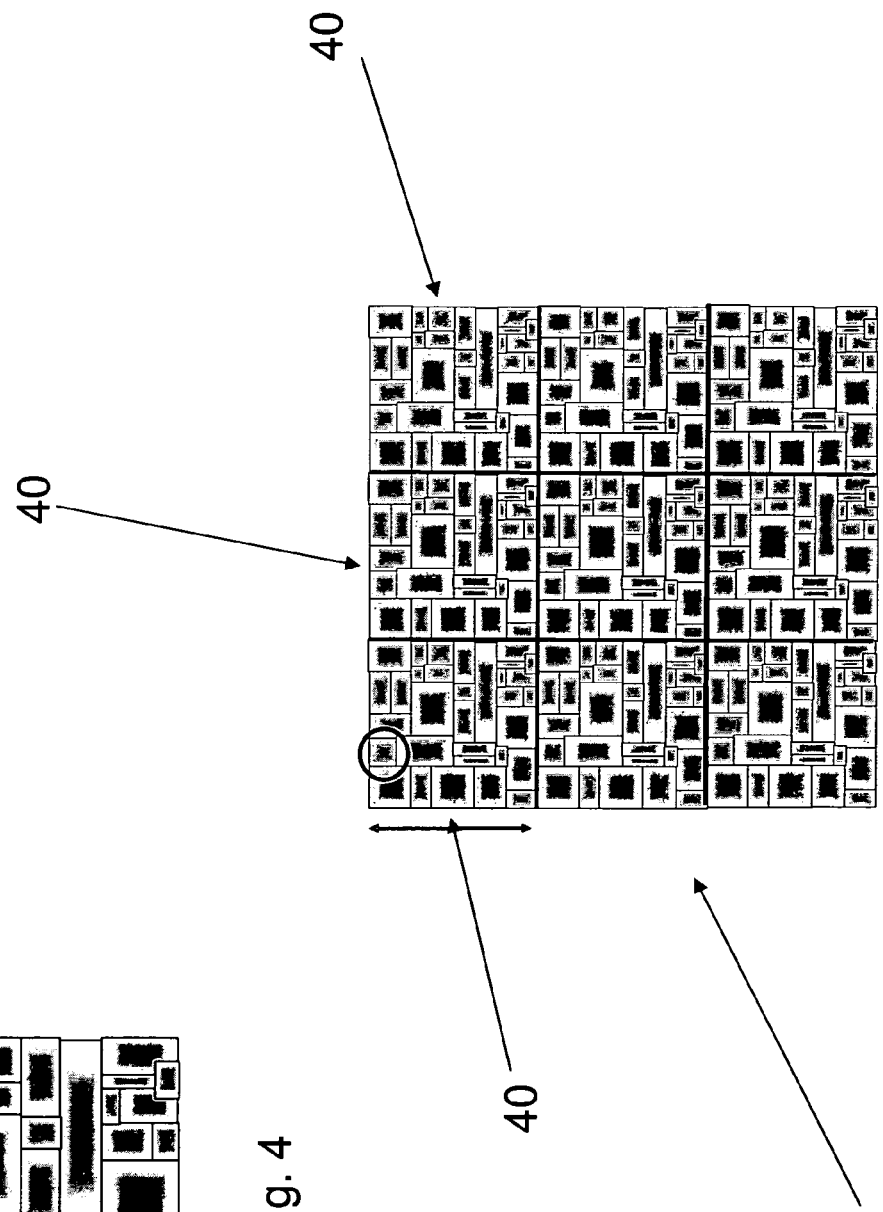
FIG. 5 shows an optical assembly including nine unit cells having an identical arrangement of the selected lenses from the ten optical elements.

FIG. 5 shows an embodiment of an optical assembly 50 including 3×3 unit cells having an identical arrangement of the selected lenses from the optical assembly including the 32 optical elements. This kind of lens array can be manufactured in a conventional way. It should be appreciated that the design of the lay-out of a single unit cell may use computer aided design and by repeating the unit cell in both directions until the dimensions of the array are filled up. The size of the unit cell in the non-scanning direction may be larger than one twelfth, for example one tenth, of the width of the rectangular illumination field in the non-scaning direction. In this embodiment that size may be larger than or equal to 2.3 mm. The dimensions of the unit cell are, for example, 3×3 mm².

Figure 6:
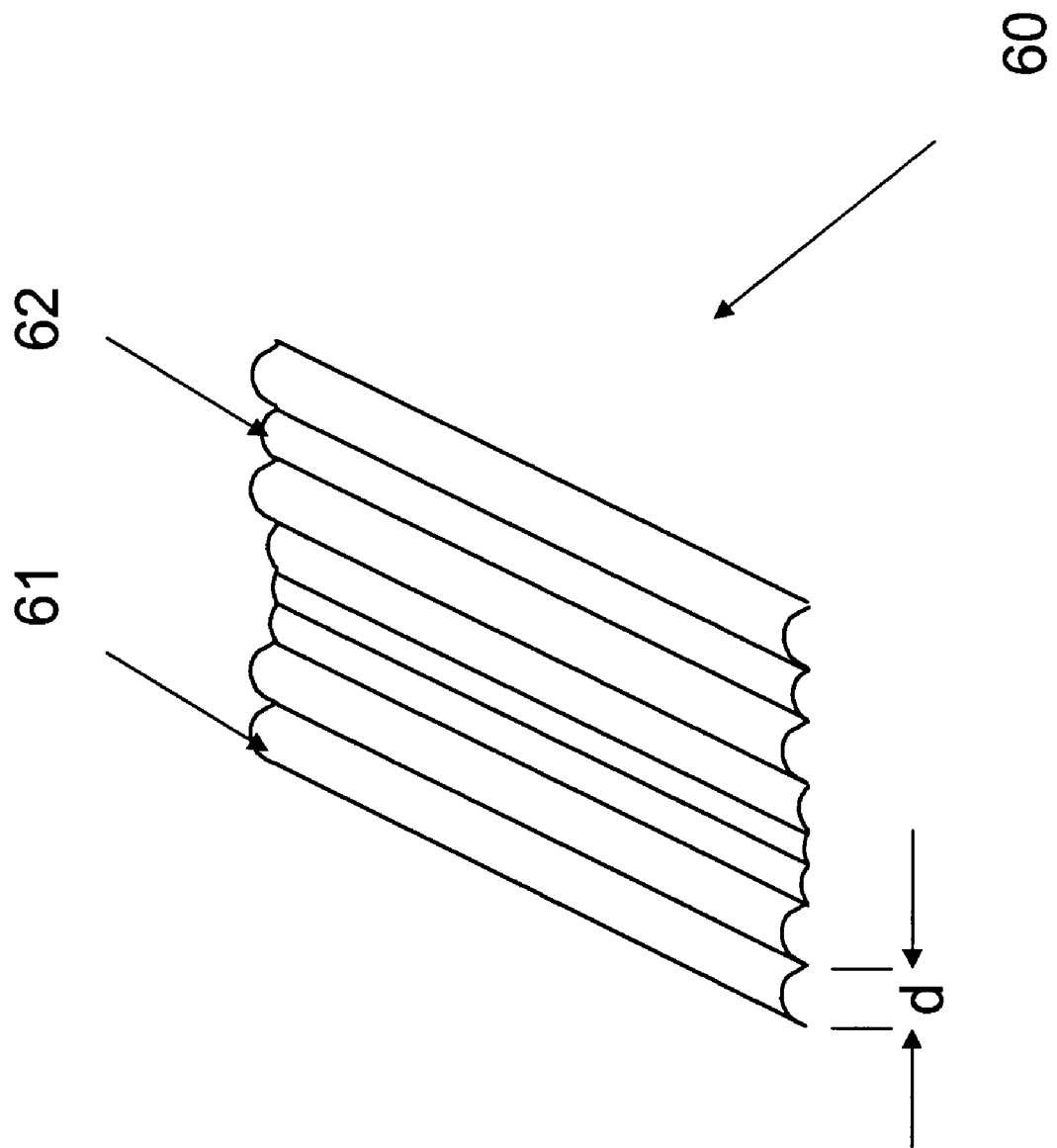
FIG. 6 shows an optical assembly including a selection of lenticulars from a set of lenticulars having an equal radius, but different diameters of the lenticular segments.

FIG. 6 shows an embodiment of an optical assembly 60 including a selection of lenticulars 61, 62 from a set of lenticulars having an equal radius, but different diameters d of the lenticular segments. Alternatively, the set may include wedges that have an equal cross-section perpendicular to the optical axis, but the exit planes are arranged with a different angle with respect to the optical axis.

Figure 7:
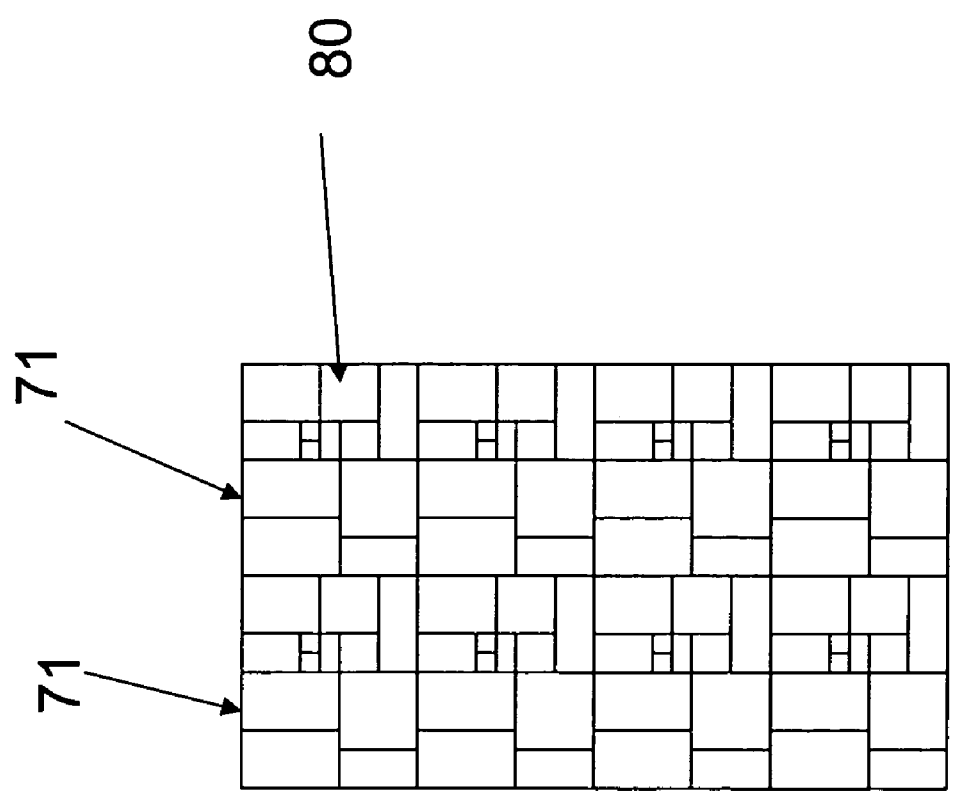
FIG. 7 shows an optical array of wedges.

FIG. 7 shows an alternative micro optical array 70 of wedge elements 80, wherein the array includes eight unit cells 71.

Figure 8:
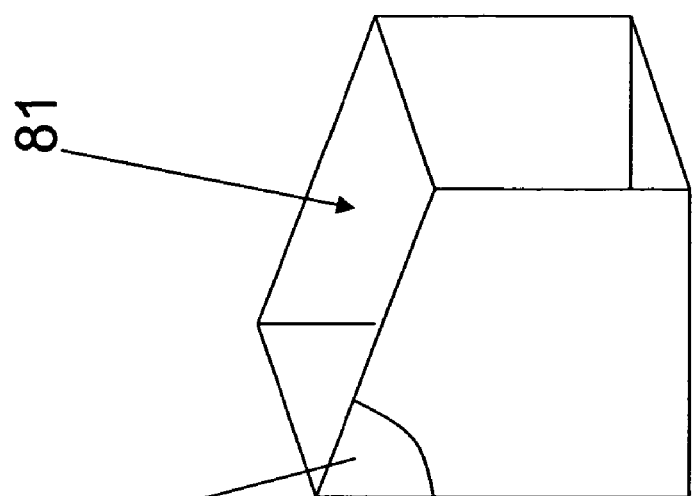
FIG. 8 shows a single wedge element of the optical array of FIG. 7.

FIG. 8 shows a single wedge element of the micro optical array 70, wherein the angle α of the normal of the exit plane 81 with the optical axis may vary between 80° and 60° in steps of 2° from the optical axis.

Figure 9:
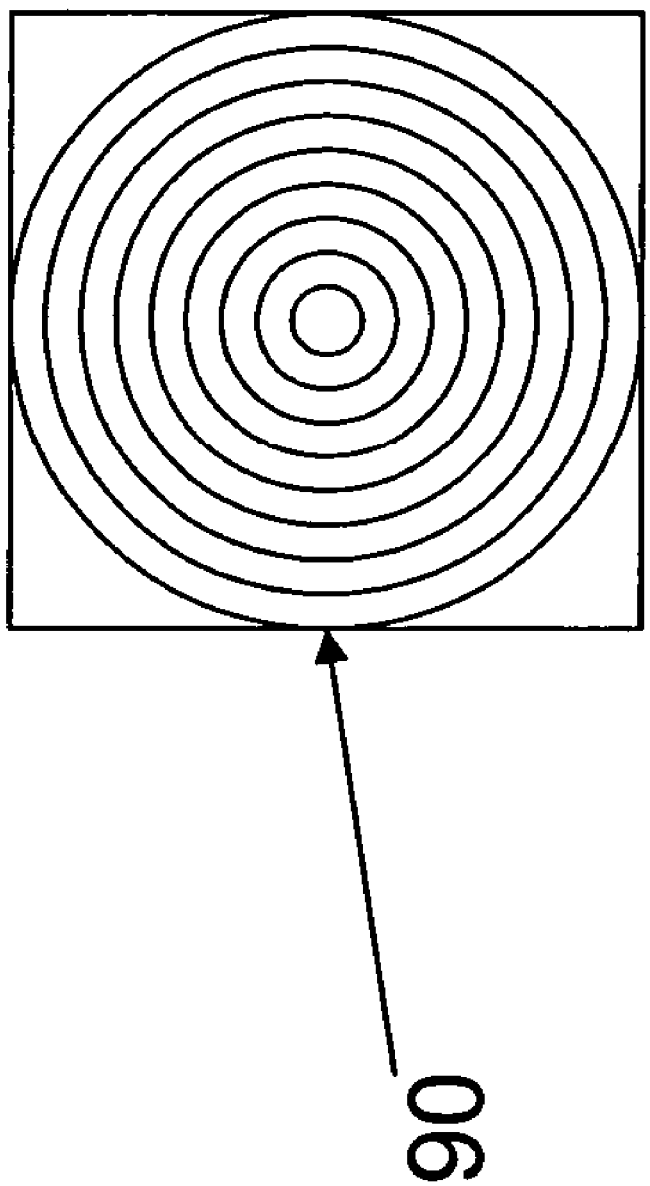
FIG. 9 shows a single Fresnel lens element.

FIG. 9 shows a single Fresnel lens element 90 which can be applied in the micro optical array in the above described embodiments.

Figure 10:
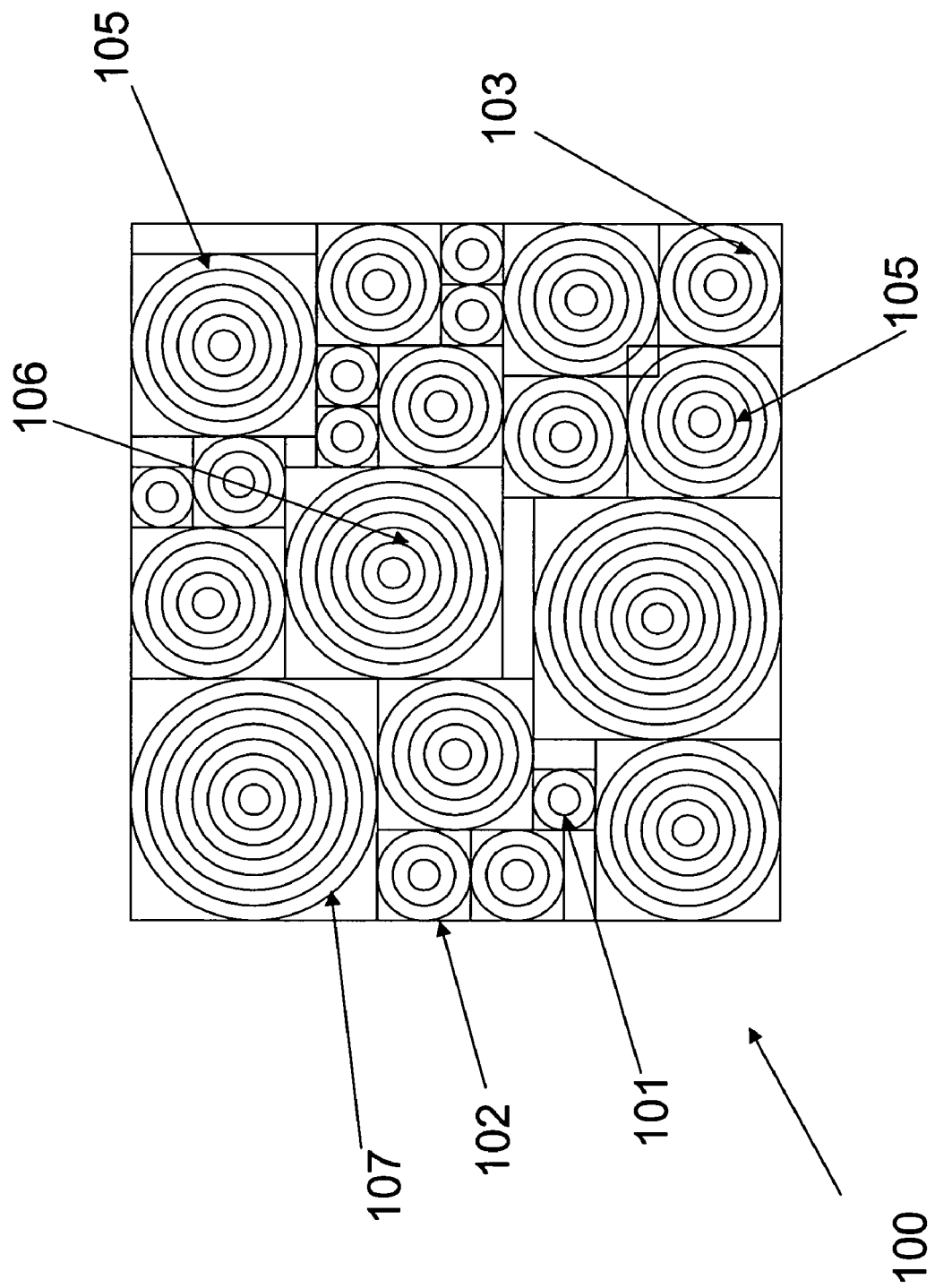
FIG. 10 shows an optical array including seven different Fresnel lenses.

FIG. 10 shows a micro lens array 100 including seven different Fresnel lenses 101–107. Furthermore, instead of a micro lens array, an array of holographical elements can be applied, wherein each of the holographical elements are designed to perform the optical functions of the respective micro lenses of the micro lens array.

Figure 11:
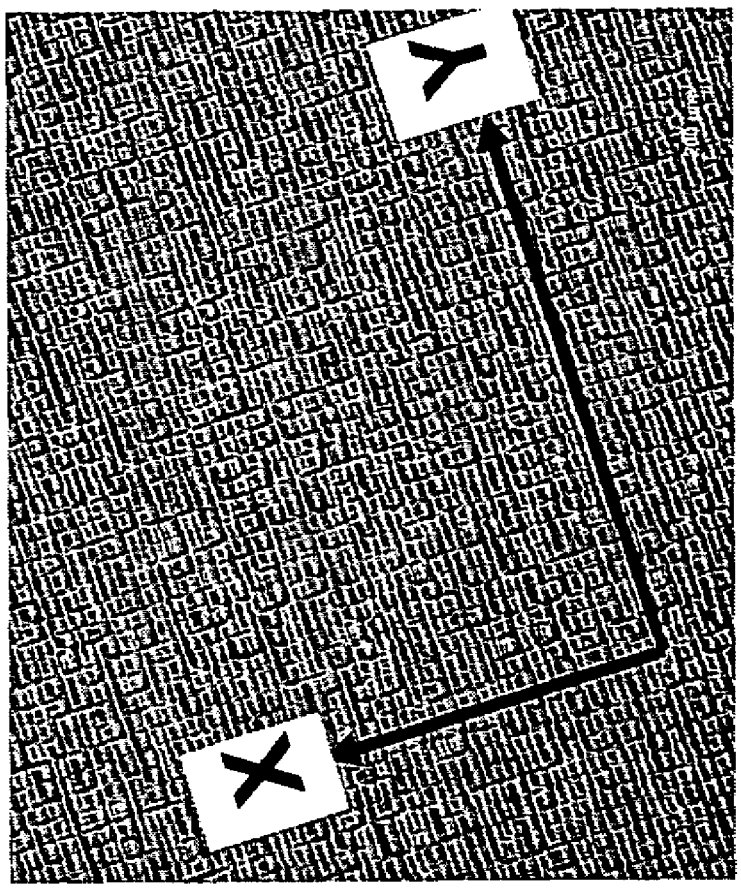
FIG. 11 shows a photograph of an optical array.

FIG. 11 shows a photograph of a micro lens array 110 that can be applied in the described embodiments. In the photograph, a first arrow X and a second arrow Y indicate the long axis and the short axis of the entrance plane of the integrating rod, respectively.

Although specific reference may be made in this text to the use of lithographic apparatus in the manufacture of ICs, it should be appreciated that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation, e.g. having a wavelength of or about 365, 355, 248, 193, 157 or 126 nm, and extreme ultra-violet (EUV) radiation, e.g. having a wavelength in the range of 5–20 nm.

While specific embodiments of the present invention have been described above, it will be appreciated that the present invention may be practiced otherwise than as described. For example, the present invention may take the form of a computer program containing one or more sequences of machine-readable instructions describing a method as disclosed above, or a data storage medium e.g. semiconductor memory, magnetic or optical disk, having such a computer program stored therein.

The descriptions above are intended to be illustrative, not limiting. Thus, it should be appreciated that modifications may be made to the present invention as described without departing from the scope of the claims set out below.

What is claimed is:

1. A lithographic apparatus, comprising:
   an illumination system configured to condition a radiation beam;
   a support structure configured hold a patterning device, the patterning device configured to impart the radiation beam with a pattern in its cross-section to form a patterned radiation beam;
   a projection system configured to project the patterned radiation beam onto a substrate; and
   an optical assembly comprising a plurality of optical elements two-dimensionally arranged between a radiation source configured to supply the radiation beam and the support structure and transversely to and in a path of the radiation beam, the optical assembly configured to create a predetermined angular distribution of the radiation beam, the optical elements being selected from at least 3 different sizes of optical element and wherein each of at least 3 different sizes of optical element are represented in a line of optical elements of the plurality of optical elements.

2. A lithographic apparatus according to claim 1, wherein all the optical elements are of the same type.

3. A lithographic apparatus according to claim 2, wherein at least some of the optical elements are lenses of different power.

4. A lithographic apparatus according to claim 2, wherein the optical elements are lenses of equal power.

5. A lithographic apparatus according to claim 3, wherein the lenses have an aspherical shape.

6. A lithographic apparatus according to claim 4, wherein the lenses have an aspherical shape.

7. A lithographic apparatus according to claim 3, wherein a diameter of a largest lens is five times the diameter of a smallest lens.

8. A lithographic apparatus according to claim 3, wherein a shape of a cross-section transverse to the optical axis of an optical element is a polygon.

9. A lithographic apparatus according to claim 8, wherein angles of the polygon are +90° or −90°.

10. A lithographic apparatus according to claim 1, comprising at least ten optical elements of different size.

11. A lithographic apparatus according to claim 1, wherein the optical elements are arranged in a rectangle.

12. A lithographic apparatus according to claim 3, wherein an average diameter of positive lenses is about 80 μm.

13. A lithographic apparatus according to claim 2, wherein the optical elements are Fresnel elements or holographic elements.

14. A lithographic apparatus according to claim 2, wherein the optical elements are wedges having exit planes arranged with a different angle of the normal of the exit plane with respect to an optical axis of the lithographic apparatus.

15. A lithographic apparatus according to claim 1, wherein the support structure is moveable in the lithographic apparatus in a scanning direction perpendicular to an optical axis.

16. A lithographic apparatus according to claim 15, wherein the optical assembly is configured to illuminate a rectangular illumination field of the patterning device, and a long axis of the rectangular area is directed along a non-scanning direction perpendicular to the scanning direction.

17. A lithographic apparatus according to claim 16, wherein the optical assembly comprises a plurality of unit cells having an identical arrangement of optical elements having different shapes.

18. A lithographic apparatus according to claim 17, wherein a size of each unit cell in the non-scanning direction is larger than one tenth of the size of the rectangular illumination field in the non-scanning direction.

19. A lithographic apparatus according to claim 1, wherein the optical assembly comprises a plurality of unit cells having an identical arrangement of optical elements having different shapes.

20. A lithographic apparatus according to claim 1, wherein the optical elements are integrated in a single optical structure.

21. A lithographic apparatus according to claim 1, wherein an integrator rod is arranged between the optical assembly and the support structure to equalize the uniformity of the intensity distribution of the radiation beam.

22. A lithographic apparatus, comprising:
   an illumination system configured to provide a radiation beam;
   a support structure configured hold a patterning device, the patterning device configured to impart the radiation beam with a pattern in its cross-section to form a patterned radiation beam;
   a projection system configured to project the patterned radiation beam onto a substrate; and
   an optical assembly comprising multiple optical elements two-dimensionally arranged transversely in and to a path of the radiation beam and configured to create a predetermined angular distribution of the radiation beam, each of at least some of the optical elements having a different diameter.

23. A lithographic projection apparatus configured to project a patterned radiation beam onto a substrate, wherein the lithographic projection apparatus comprises an optical assembly comprising multiple optical elements two-dimensionally arranged transversely to and in a path of the radiation beam and configured to create a predetermined angular distribution of the radiation beam, at least some of the optical elements being wedges, each wedge having an exit plane arranged with a different angle of the normal of the exit plane with respect to an optical axis of the lithographic projection apparatus.

24. A lithographic apparatus, comprising:
an illumination system configured to provide a radiation beam;
a support structure configured hold a patterning device, the patterning device configured to pattern the radiation beam;
a projection system configured to project the patterned radiation beam onto a substrate, wherein the illumination system comprises an optical assembly comprising multiple optical elements two-dimensionally arranged between a radiation source configured to generate radiation and the patterning device and transversely to and in a path of the radiation beam, the optical elements configured to create a predetermined angular distribution of the radiation beam, at least some of the optical elements each having a shape of a cross-section transverse to an optical axis of the optical element that is rectangular and each of the at least some of the optical elements having a different size.

25. An integrated device manufacturing method, comprising:
providing a radiation beam;
patterning the radiation beam; and
projecting the patterned radiation beam onto a target portion of a substrate, wherein providing the radiation beam comprises creating a predetermined angular distribution of the radiation beam by passing the radiation beam through an optical assembly comprising multiple optical elements two-dimensionally arranged transversely to and in the radiation beam, the optical elements being selected from at least 3 different sizes of optical element and wherein each of at least 3 different sizes of optical element are represented in a line of optical elements of the plurality of optical elements.

26. A device manufacturing method according to claim 25, wherein the optical elements are lenses and at least some of the optical elements have an aspherical shape.

27. A device manufacturing method according to claim 25, comprising at least ten optical elements of different shape.

* * * * *